United States Patent [19]

Nakano et al.

[11] Patent Number: 5,607,569
[45] Date of Patent: Mar. 4, 1997

[54] METHOD OF FABRICATING CERAMIC PACKAGE BODY FOR HOLDING SEMICONDUCTOR DEVICES

[75] Inventors: Sumio Nakano; Kazumi Hirashita; Reiko Sumida, all of Yamaguchi, Japan

[73] Assignee: Kabushiki Kaisha Sumitomo Kinzoku Ceramics, Yamaguchi, Japan

[21] Appl. No.: 486,618

[22] Filed: Jun. 7, 1995

Related U.S. Application Data

[62] Division of Ser. No. 143,572, Oct. 26, 1993, abandoned.

[30] Foreign Application Priority Data

Oct. 26, 1992 [JP] Japan .................................. 4-311411
Sep. 16, 1993 [JP] Japan .................................. 5-254835

[51] Int. Cl.$^6$ .............................. C25D 5/02; C25D 5/54; H01L 21/18; H01L 21/60
[52] U.S. Cl. ..................... 205/118; 205/122; 205/162; 437/209; 437/218; 257/784
[58] Field of Search ..................... 205/118, 122, 205/162, 163, 219, 221, 125; 257/700, 784; 437/209 WB, 218; 228/180.5, 904

[56] References Cited

U.S. PATENT DOCUMENTS 3,926,746  12/1975  Hargis ........................................ 156/89

FOREIGN PATENT DOCUMENTS 62-8547   1/1987  Japan .
4-79257   3/1992  Japan .
5-136212  1/1993  Japan .

*Primary Examiner*—Donald R. Valentine
*Assistant Examiner*—Edna Wong
*Attorney, Agent, or Firm*—Flynn, Thiel, Boutell & Tanis, P.C.

[57] ABSTRACT

A method of fabricating a ceramic package body for holding semiconductor devices which include external terminals arranged on an outer surface of the ceramic package body, a first conductive pattern having first conductors connected respectively to the external terminals, and a second conductive pattern having second conductors not connected to any said external terminal. The methodology includes a forming of the first and second conductive patterns on a green sheet so as to form the ceramic package body; a forming of a short-circuiting conductive pattern having one end connected to the external terminal and formed so as to be connected to the second conductive pattern to connect the second conductive pattern to the external terminal; a forming of the laminate body by laminating the green sheets; a firing of the laminate body; a plating of the external terminals, and the exposed portions of the first conductive pattern and the second conductive pattern by an electrolytic plating process with the external terminals connected to a plating electrode; and a removing of a portion of the short-circuiting pattern connected to the second conductive pattern by cutting so as to disconnect the second conductive pattern from the short-circuiting pattern to make the second conductors of the second conductive pattern become floating conductors.

4 Claims, 5 Drawing Sheets

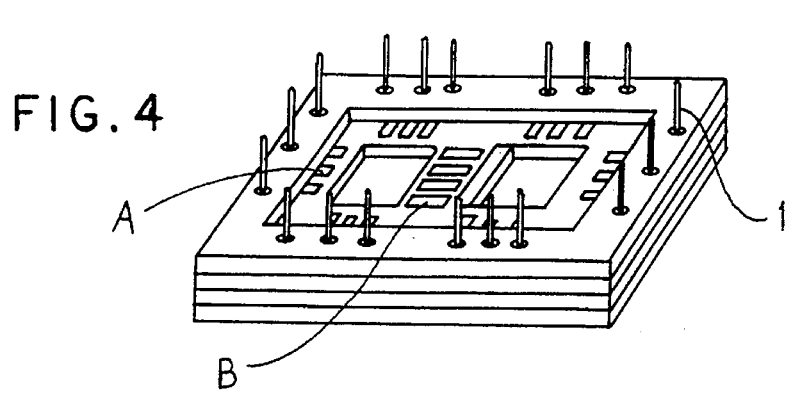
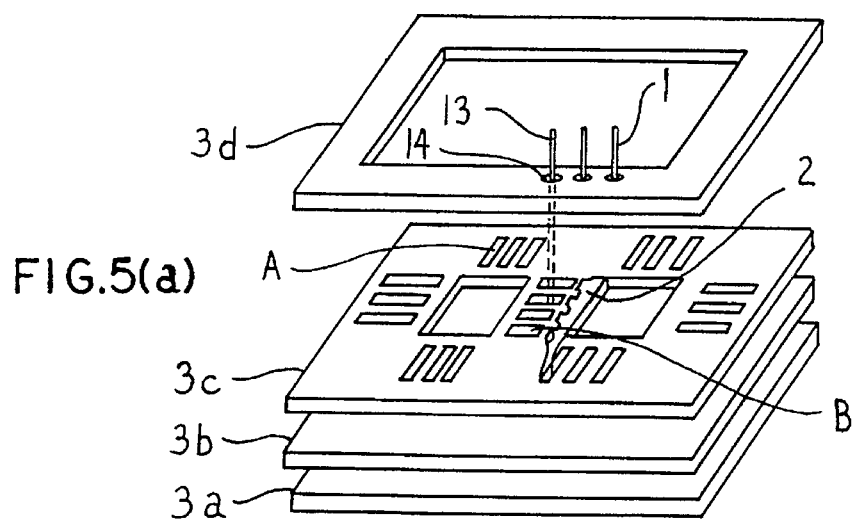
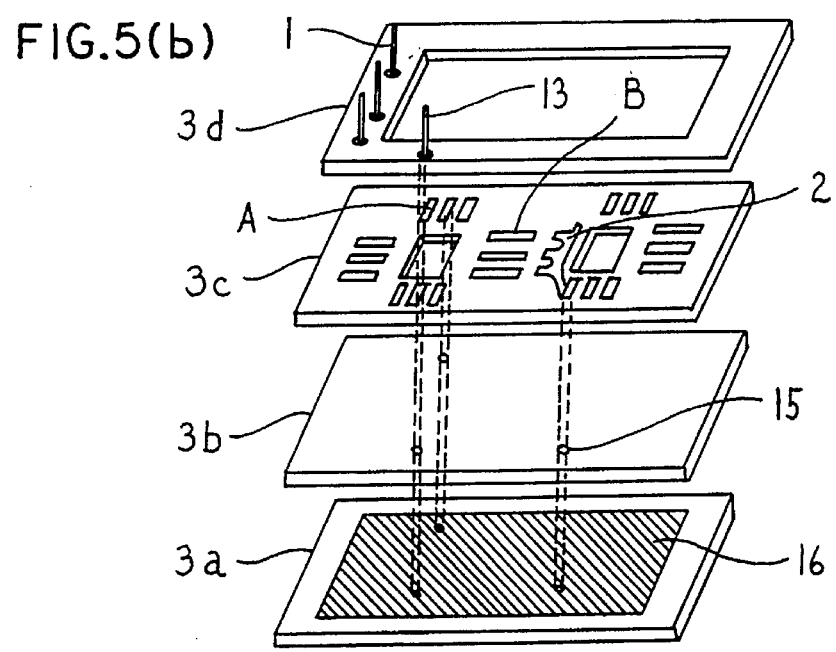

METHOD OF FABRICATING CERAMIC PACKAGE BODY FOR HOLDING SEMICONDUCTOR DEVICES

This is a division of Ser. No. 08/143,572, filed Oct. 26, 1993, now abandoned.

FIELD OF THE INVENTION

The present invention relates to a method of fabricating a ceramic package body for holding semiconductor devices. More specifically, the present invention relates to a method for fabricating a ceramic package body for holding semiconductor devices having floating, conductive patterns not connected to external terminals, enabling conductors formed on the surface thereof to be plated with Au and Ni by an electrolytic plating process.

BACKGROUND OF THE INVENTION

The recent progressive development of high-speed semiconductor devices and progressive increase in the degree of integration require packaging of a plurality of IC chips and circuit parts in a single package. Such a package needs floating, conductive patterns, which are not connected to external terminals, for interconnecting the IC chips and the circuit parts packaged thereon.

A ceramic package body for mounting semiconductor devices is fabricated through steps of forming a plurality of green sheets, forming through holes in the green sheets, printing conductive patterns on the green sheets, laminating and firing the green sheets, and surface-treating the exposed conductive patterns to protect the conductive patterns from oxidation and such. Normally, the exposed surfaces of the conductive patterns are Ni- and Au-plated. In view of facility and efficiency, the exposed surfaces of the conductive patterns are plated by an electrolytic plating process, in which the external terminals are connected to the plating electrodes. However, the conductors of the floating, conductive patterns cannot be plated by the electrolytic plating because they are not connected to the external terminals. Therefore, the conductors of the floating, conductive patterns are plated by an electroless plating process.

The electroless plating process, however, compares unfavorably with the electrolytic plating process in respect of mass-productivity, quality and plating cost. A plating process proposed previously in Japanese Patent Publication (Kokoku) No. 1-38396 to solve the foregoing problems includes the steps of temporarily short-circuiting the terminals of floating, conductive patterns with a conductive paste, supplying current through the conductive paste and the terminals to the floating, conductive patterns in an electrolytic plating bath for electrolytic plating, and removing the conductive paste to disconnect the short-circuited terminals of the floating, conductive patterns.

This known plating process has the following problems.

(1) The conductive paste short-circuiting the terminals must be removed after the completion of the electrolytic plating process and, in some cases, the conductive paste cannot be perfectly removed, which limits the mass-productivity of the plating process.

(2) If the conductive plate is not removed perfectly, the package is rejected.

(3) The conductive paste disperses in the plating bath to contaminate the latter.

SUMMARY OF THE INVENTION

Accordingly, it is a first object of the present invention to provide a method for fabricating a ceramic package body for holding semiconductor devices which is capable of solving the foregoing problems in the prior art.

A second object of the present invention is to provide a method for fabricating a ceramic package body for holding semiconductor devices which has floating, conductive patterns not connected to external terminals and has conductive patterns formed on the outer surfaces thereof and plated with Au and Ni or the like by an electrolytic plating process.

A third object of the present invention is to provide a method for fabricating a ceramic package body for holding semiconductor devices which is capable of avoiding the adverse electrical effects of the floating, conductive patterns on the adjacent conductive patterns.

The above and other objects of the present invention will become more apparent from the following description taken in connection with the accompanying drawings.

An aspect of the present invention involves a method of fabricating a ceramic package body for holding semiconductor devices which includes exposed external terminals; a first conductive pattern A connected to the external terminals; a second conductive pattern B not connected to the external terminals; and a short-circuiting conductive pattern for short-circuiting the second conductive pattern B having one end connected to the external terminal, the method including the steps of: plating the external terminals, the first conductive pattern A and the second conductive pattern B by an electrolytic plating process; and disconnecting the second conductive pattern B from the short-circuiting conductive pattern after completing the electrolytic plating process to use the second conductive pattern B as a floating, conductive pattern.

The method of fabricating a ceramic package body for holding semiconductor devices in accordance with the present invention is capable of fabricating a ceramic package body provided with a floating, conductive pattern through steps similar to those used for fabricating a ceramic package body not provided with any floating, conductive pattern, because the method short-circuits the second conductive pattern B by the short-circuiting conductive pattern, and disconnects the second conductive pattern B from the short-circuiting conductive pattern after plating the first conductive pattern A, the second conductive pattern B and the short-circuiting conductive pattern to use the second conductive pattern B as a floating, conductive pattern.

Maintaining the short-circuiting conductive pattern at a ground potential avoids the adverse electrical influence of the capacitive or inductive coupling of the short-circuiting conductive pattern and one of the floating conductors of the floating, conductive pattern on the other floating conductors of the floating, conductive pattern. For example, in a state where the short-circuiting conductive pattern is connected to an isolated terminal, namely, a terminal not connected to any circuit, the potential of the short-circuiting conductive pattern varies if the potential of a particular floating conductor of the floating, conductive pattern varies when IC chips mounted on the ceramic package body are operated and, consequently, the potentials of the other floating conductors of the floating, conductive patterns are caused to vary. The variation of the potentials of the floating conductors of the floating, conductive patterns of a ceramic package body provided with conductive patterns consisting of minutely arranged conductors will cause the IC chips to malfunction. The inventors of the present invention found through the assiduous study of the problems that it is possible to secure stable operation of the IC chips mounted on the ceramic package body by maintaining the short-circuiting conductive pattern at a ground potential. When at least the exposed surface of the short-circuiting conductive pattern is coated with an insulating layer, the accidental short-circuiting of bonding wires and the short-circuiting conductive pattern can be prevented when connecting semiconductor devices to the second conductive pattern B with the bonding wires.

BRIEF DESCRIPTION OF THE DRAWINGS

FIG. 4 is a perspective view of a structure shown in FIG. 2(d);

FIG. 5(a) is an exploded perspective view showing a ceramic package body in a second embodiment according to the present invention;

FIG. 5(b) is exploded perspective view of a modification of the ceramic package body of FIG. 5(a)

DETAILED DESCRIPTION

Figure 1A:
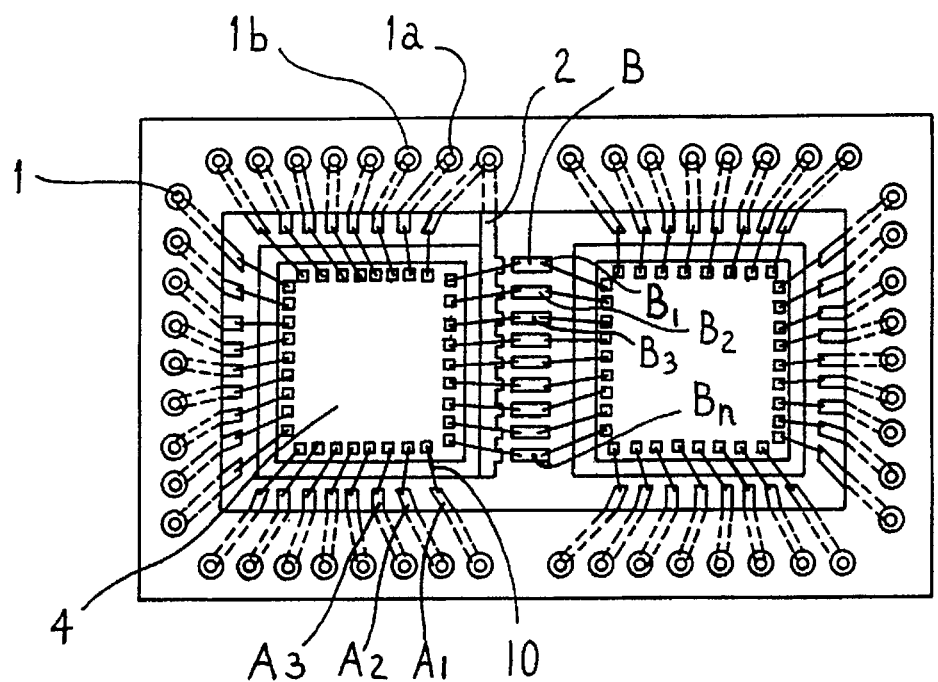
FIG. 1(a) is a plan view of a ceramic package body in a first embodiment according to the present invention, with semiconductor devices mounted thereon.

The present invention will be described hereinafter with reference to the accompanying drawings.

FIRST EMBODIMENT

A ceramic package body for holding semiconductor devices, in a first embodiment according to the present invention, comprises as principal components external terminals 1, i.e., lead pins and such, a ceramic package body 9 (FIG. 1b), a lid 11, a first conductive pattern A consisting of a plurality of first conductors $A_1, A_2, A_3, \ldots A$ connected respectively to the external terminals 1, a second conductive pattern B consisting of a plurality of second conductors $B_1, B_2, B_3, \ldots Bn$, and a short-circuiting conductive pattern 2. The pattern 2 is formed to connect the second conductive pattern B to the external terminal 1 of the first conductive pattern A for processing the second conductive pattern B by an electrolytic plating process, and is disconnected from the second conductive pattern B after plating the second conductive pattern B to use the second conductors $B_1, B_2, B_3, \ldots Bn$ as floating conductors.

Figure 1B:
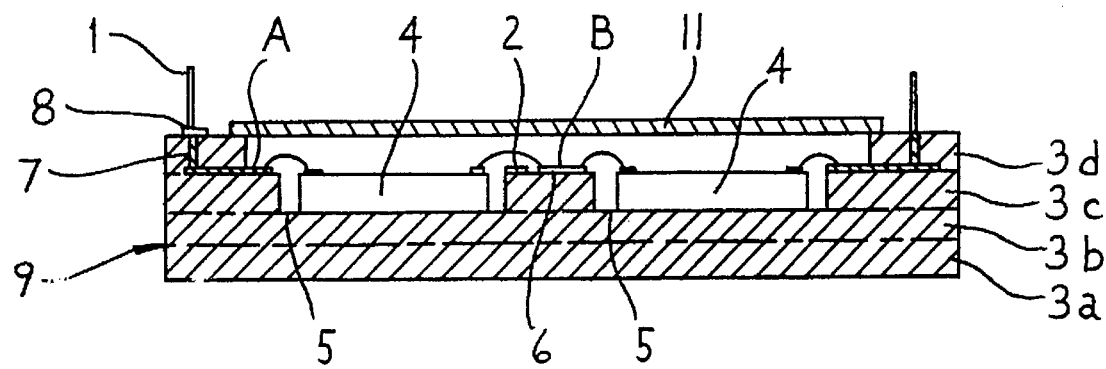
FIG. 1(b) is a cross sectional view of the ceramic package of FIG. 1(a) with a ceramic lid.

As shown in FIG. 1(b), ceramic package body 9, which is fired, has four ceramic lamina 3a, 3b, 3c and 3d, and cavities 5 in which to place semiconductor devices 4. The ceramic lamina 3c is provided with the first conductive pattern A to be connected to the external terminals 1, and the second conductive pattern B formed on a narrow portion 6 between the cavities 5. The ceramic lamina 3d has pads 8 for the external terminals 1 formed on its upper surface at positions corresponding respectively to the through holes 7. The exposed portions of the conductive patterns are plated by an electrolytic plating process.

If the second conductive pattern B consisting of the second conductors $B_1, B_2, B_3, \ldots Bn$ is in a floating state, it is impossible to plate the conductive pattern B by the electrolytic plating process. Therefore, the second conductive pattern B is indirectly connected to the external terminal 1 by the short-circuiting pattern 2 formed by printing a conductive material to one of the first conductors of the first conductive pattern A, or is directly connected to the external terminal 1 by the short-circuiting pattern 2. The short-circuiting pattern 2 is disconnected electrically from the second conductive pattern B after plating to make the second conductive pattern B serve as a floating, conductive pattern.

A method of fabricating the ceramic package body for holding semiconductor devices in the first embodiment will be described hereinafter. The method includes as principal processes: (1) a green sheet forming process, (2) a through hole forming and conductive pattern printing process, (3) a green sheet laminating and firing process, (4) an electrolytic plating process, and (5) a floating conductive pattern forming process.

Green Sheet Forming Process

As shown in FIG. 2(a), 2(b), 3(a) and 3(b), the four green sheets 3a', 3b', 3c' and 3d' are formed by casting a ceramic material containing alumina as a principal component. The two openings 5c for defining cavities 5 in which to be placed the semiconductor devices 4 are formed in the green sheet 3c', and the opening capable of exposing the two openings 5c of the green sheet 3c' is formed in the green sheet 3d'.

Through Hole Forming and Conductive Pattern Printing Process

Figure 2A:
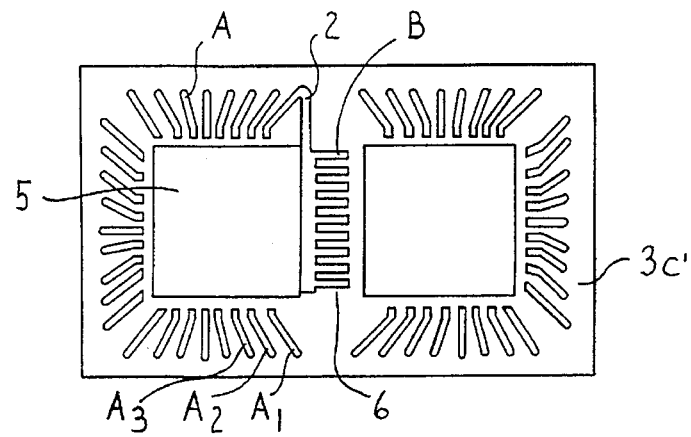
FIGS. 2(a), 2(b), 2(c) and 2(d) are plan views of portions of the ceramic package body of FIG. 1 which are of assistance in explaining a method of fabricating the ceramic package body of FIG. 1.
Figure 2B:
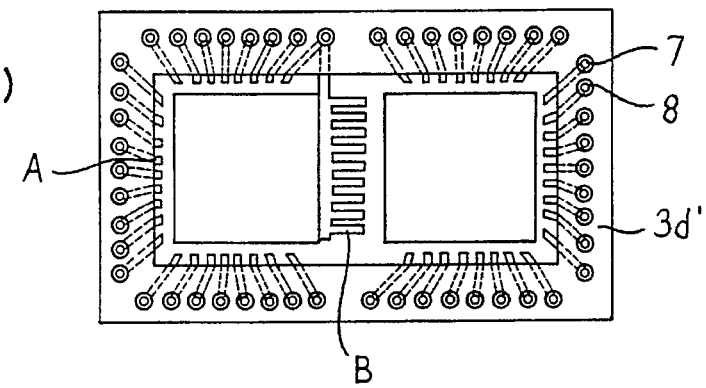

The first conductive patterns A to be connected to the external terminals 1, the second conductive pattern B to form a floating, conductive pattern, and the short-circuiting conductive pattern 2 are printed on the green sheet 3c' as shown in FIG. 2(a), and through holes 7 are formed in the green sheet 3d' as shown in FIG. 2(b). Generally, the conductive patterns A, B and 2 are formed by printing a conductive paste, such as a tungsten paste or a molybdenum paste, by a screen printing process. The pads 8 are formed on the upper surface of the green sheet 3d' at positions corresponding respectively to the external terminals 1. The second conductive pattern B consisting of the second conductors $B_1, B_2, B_3, \ldots Bn$, which are not to be connected to the external terminals 1, is connected to one of the external terminals 1 by the short-circuiting pattern 2 to enable plating of the second conductive pattern B by the electrolytic plating process. The first conductive pattern A, the second conductive pattern B and the short-circuiting pattern 2 are formed simultaneously on the green-sheet 3c' by printing.

Green Sheet Laminating and Firing Process

Figure 3A:
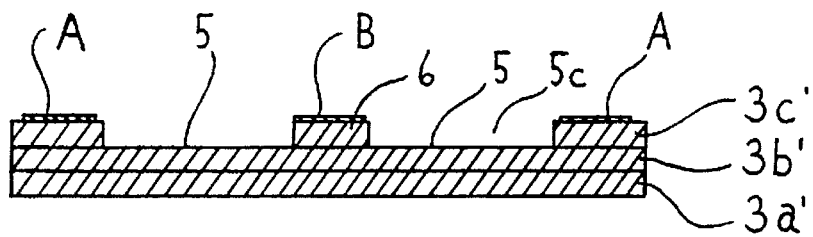
FIGS. 3(a), 3(b), 3(c) and 3(d) are sectional side views corresponding respectively to FIGS. 2(a), 2(b), 2(c) and 2(d)
Figure 3B:
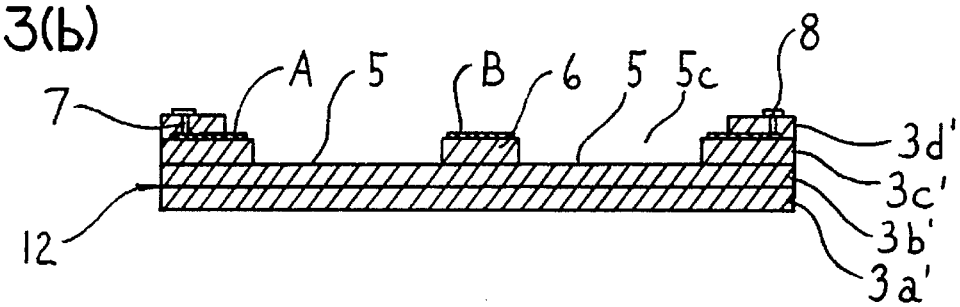
Figure 3C:
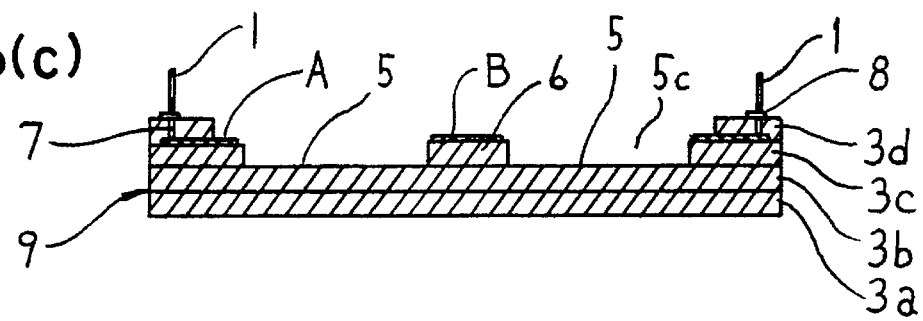
Figure 3D:
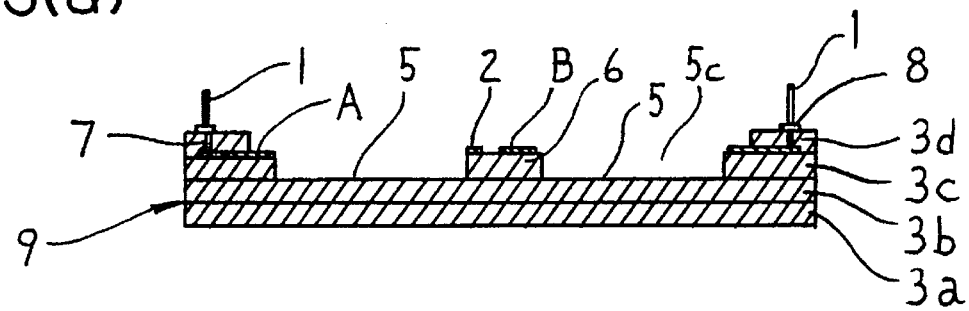

A laminate body 12 formed by laminating the green sheets 3a', 3b', 3c' and 3d' is compressed, and then the laminate body 12 is fired at temperature in the range 1500°–1800° C. Then, the external terminals 1 are brazed to the pads 8 on the fired ceramic package body 9 as shown in FIG. 3(c).

Electrolytic Plating Process

Figure 2C:
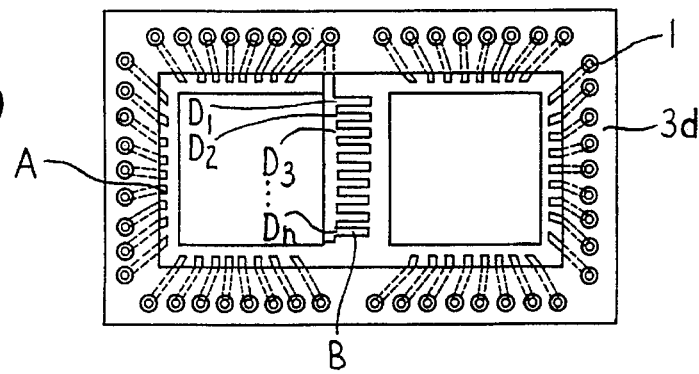

The exposed portions of the first conductive pattern A, the second conductive pattern B and exposed metallic portions of the ceramic package body are plated as shown in FIG. 2(c) by an electrolytic plating process, in which the fired ceramic package body 9 provided with the external terminals 1 is immersed in a plating bath for Au plating and Ni plating with the external terminals 1 connected to a plating electrode. Since the second conductive pattern B is connected to the external terminal 1 by the short-circuiting conductive pattern 2, the second conductive pattern B can be plated as well as the first conductive pattern A.

Floating Conductive Pattern Forming Process

Figure 2D:
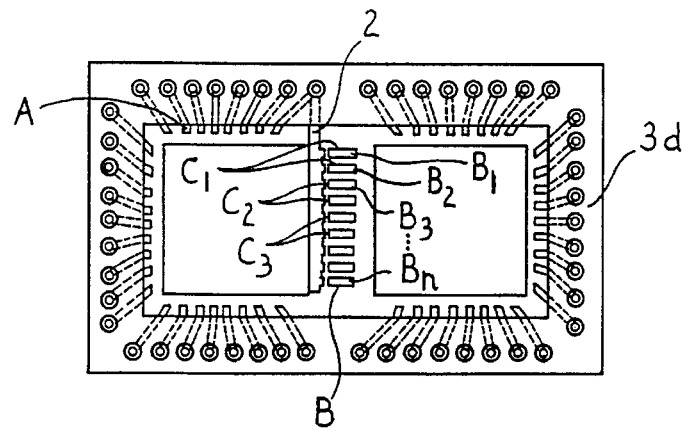

After the electrolytic plating process has been completed, a temporary connecting portion $D_1, D_2, D_3 \ldots Dn$ (see FIG. 2(c)) of the short-circuiting conductive pattern 2 is removed by a precision cutting process as at $C_1, C_2$ and $C_3$ (see FIG. 2(d)), such as a laser beam cutting process, a water-jet cutting process or a sand blast cutting process, to disconnect the second conductive pattern B from the external terminal 1 so that the second conductors $B_1, B_2, B_3, \ldots Bn$ become floating conductors (i.e., separate and independent) and without weakening the structural integrity of the laminate body 12.

Then, the semiconductor devices 4 are placed in the cavities 5 defined by the openings 5c of the lamina 3c and the upper surface of the lamina 3b, and the semiconductor devices 4 are interconnected by the second conductive pattern B in a floating state as shown in FIG. 1(a). Then the ceramic package body 9 is hermetically sealed by mean of the lid 11 as shown in FIG. 1(b).

The method of the present invention and the foregoing known method using the conductive paste for forming the short-circuiting conductive pattern 2 were compared in respect of facility in operation, mass-productivity and quality to confirm the advantages of the method of the present invention. It was found through comparative tests of the method of the present invention and the known method discussed in the introduction that the method of the present invention contaminated the plating bath less than the known method, and the method of the present invention necessitated changing of the plating bath less frequently than the known method when plating the exposed portions of the conductive patterns formed as shown in FIG. 2(c). The short-circuiting conductive pattern formed of the conductive paste employed in the known method could not be perfectly removed, which can possibly cause short-circuiting defects. Although both the method of the present invention and the known method are the same in the idea of temporarily connecting the second conductive pattern B to the external terminal 1 for the electrolytic plating process, the known method removes the short-circuiting conductive pattern by washing after the electrolytic plating process, whereas the method of the present invention removes the same by cutting. Accordingly, it is inferred that the short-circuiting defects in the ceramic package body processed by the known method are attributable to the incapability of the washing process to perfectly remove the conductive paste forming the short-circuiting conductive pattern.

In this embodiment, the second conductive pattern B is connected to the external terminal 1 by the short-circuiting conductive pattern for the electrolytic plating process and is disconnected from the short-circuiting conductive pattern after the completion of the electrolytic plating process so that the second conductive pattern B becomes a floating conductive pattern. Thus, the method in the first embodiment is capable of forming a ceramic package body provided with a floating conductive pattern by substantially the same procedure as that for forming a ceramic package body not provided with any floating conductive pattern.

SECOND EMBODIMENT

A ceramic package body in a second embodiment according to the present invention is provided with a short-circuiting conductive pattern 2 formed on a lamina 3c and connected through a through hole 14 formed in a lamina 3d overlying the lamina 3c to a grounding terminal 13 as shown in FIG. 5(a) or connected through a through hole 15 formed in a lamina 3b underlying the lamina 3c to a grounded layer 16 formed on a lamina 3a underlying the lamina 3b as shown in FIG. 5(b) to maintain the short-circuiting conductive pattern 2 at a ground potential. Since the short-circuiting conductive pattern 2 is connected to the grounding terminal 13 or the grounded layer 16, the adverse electrical effects of the capacitive and inductive coupling of the short-circuiting conductive pattern 2 and one of the conductors of a floating second conductive pattern B on the rest of the conductors of the floating second conductive pattern B can be avoided. As shown in FIG. 2(d), for example, even if the potential of the floating conductor $B_1$ of the second conductive pattern B varies when the semiconductor devices mounted on the ceramic package body are operated, the variation of the potentials of the other conductors $B_2, B_3, \ldots Bn$, noise generation and the malfunction of the semiconductor devices do not occur, because the potential of the short-circuiting conductive pattern does not vary.

To confirm the advantages of the method in the second embodiment, a ceramic package body fabricated by the method in the second embodiment (hereinafter referred to as "a ceramic package body of the present invention") and a ceramic package body provided with a short-circuiting conductive pattern not maintained at a ground potential (hereinafter referred to as "a conventional ceramic package body") were connected to a no-connection terminal and the degree of inductive coupling between, for example, pins Nos. 1a and 1b was estimated by calculation. The degree of inductive coupling in the ceramic package body of the present invention was about ⅕ that in the conventional ceramic package body, and the reduction of crosstalk due to the reduction of the degree of inductive coupling was confirmed. Thus, since the potential of the short-circuiting conductive pattern of the ceramic package body of the present invention does not vary when the semiconductor devices are operated, noise will not be generated and the malfunction of the semiconductor devices can be obviated.

Thus, the method in the second embodiment facilitates a fabricating of a ceramic package body in which the adverse electrical effects of the capacitive or inductive coupling of the short-circuiting conductive pattern and one of the floating second conductors of the second conductive pattern on the rest of the floating second conductors can be avoided. Incidentally, it is common to connect the short-circuiting conductive pattern to an optional external terminal. For example, if the short-circuiting conductive pattern is connected to an isolated terminal not connected to any circuit, the potential of the short-circuiting conductive pattern varies if the potential of one particular floating conductor of the second conductive pattern varies when the semiconductor devices mounted on the ceramic package body are driven. Consequently, the potentials of the other floating conductors of the second conductive pattern vary, which causes the malfunction of the semiconductor devices mounted on the ceramic package body, particularly when the ceramic package body is provided with conductive patterns consisting of conductors arranged in a minute arrangement. Such an unstable operation of the semiconductor devices can be avoided by maintaining the short-circuiting conductive pattern at a ground potential.

THIRD EMBODIMENT

Figures 1, 6A:
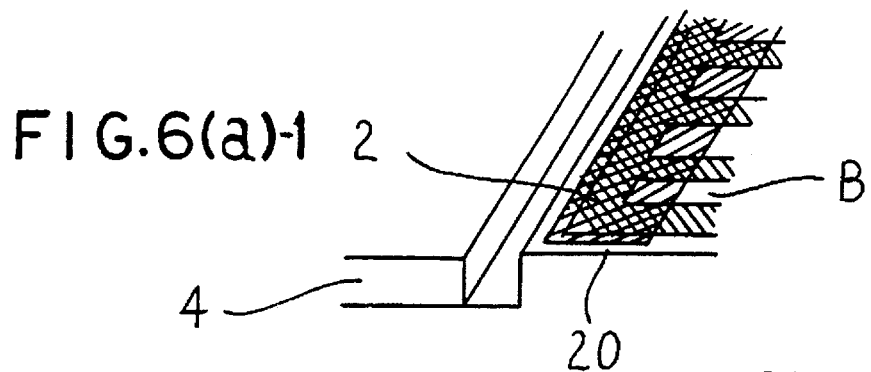
FIGS. 6(a)-1, 6(a)-2 and 6(b)-1, 6(b)-2 are each, respectively, perspective views and a cross-sectional view used as visual aids in explaining the relation between a short-circuiting conductive pattern and a second conductive pattern B.
Figures 2, 6A:
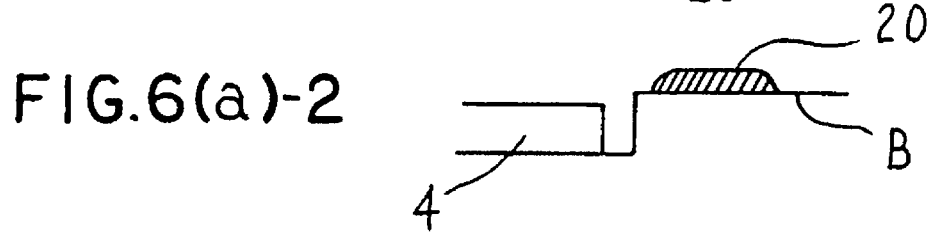
Figures 1, 6B:
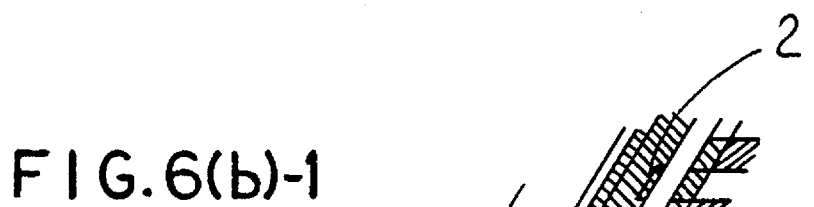
Figures 2, 6B:
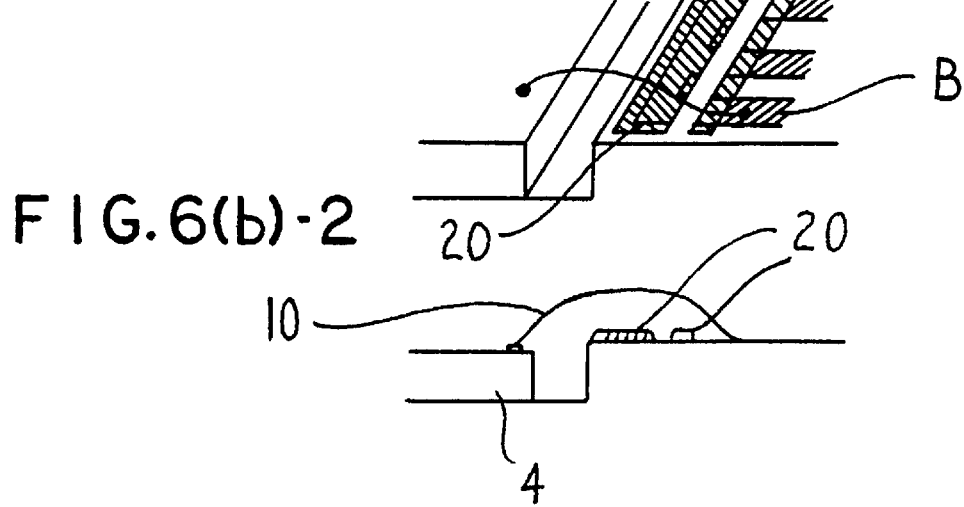

A ceramic package body in a third embodiment (FIGS. 6(a)-1, 6(a)-2) according to the present invention is similar in construction to those in the first and second embodiments, except that the ceramic package body in the third embodiment is provided with an insulating layer 20 covering a short-circuiting conductive pattern 2 and a portion of a second conductive pattern B, as shown in FIGS. 6(a)-1 and 6(a)-2. When fabricating this ceramic package body, the short-circuiting conductive pattern 2, and a portion of the second conductive pattern B in a region where the second conductive pattern B is connected to the short-circuiting conductive pattern 2 are coated with the insulating layer 20 after printing the conductive pattern by the printing process. Then the green sheets fabricating the ceramic package body are laminated and fired. And then the exposed portion of the conductive patterns are subjected to an electrolytic plating process. After the completion of the electrolytic plating process, a portion of the short-circuiting conductive pattern 2 and a portion of the insulating layer 20 corresponding to the portion of the short-circuiting conductive pattern 2 are cut with a laser beam or the like to disconnect the second conductive pattern B from the short-circuiting pattern 2 (as shown in FIGS. 6(b)-1 and 6(b)-2). Accordingly, the remaining portions of the second conductive pattern B and the short-circuiting conductive pattern 2 are coated with the insulating layer 20 and are not exposed. The portion of the second conductive pattern B need not necessarily be coated with the insulating layer 20 and only the short-circuiting conductive layer 2 may be entirely coated with the insulating layer 20.

Since the short-circuiting conductive pattern 2 is coated with the insulating layer 20, the accidental short-circuiting of bonding wires and the short-circuiting conductive pattern can be avoided when connecting the semiconductor devices 4 to the second conductive pattern B by the bonding wires 10. In this embodiment, the insulating layer 20 is formed by printing a paste of the same material as that forming the green sheets 3.

Even if only the short-circuiting conductive pattern 2 is coated entirely with the insulating layer 20, the accidental short-circuiting of the bonding wire and the short-circuiting conductive pattern 2 can be avoided when bonding the semiconductor devices to the second conductive pattern B with the bonding wires 10.

As many apparently widely different embodiments of this invention may be made without departing from the spirit and scope thereof, it is to be understood that the invention is not limited to the specific disclosed embodiments thereof but rather is defined by the scope of the appended claims.

The embodiments of the invention in which an exclusive property or privilege is claimed are defined as follows:

1. A method of fabricating a ceramic package body for holding semiconductor devices which includes external terminals arranged on an outer surface of the ceramic package body, a first conductive pattern having first conductors connected respectively to the external terminals, and a second conductive pattern having second conductors not connected to any of said external terminals, said method comprising the steps of:

forming the first and second conductive patterns on a green sheet to form a part of the ceramic package body;

forming on said green sheet a short-circuiting conductive pattern having one end connected to at least one of the external terminals and further connected to the second conductive pattern to connect the second conductive pattern to the at least one of the external terminals;

forming a laminate body by laminating plural green sheets;

firing the laminate body;

plating the external terminals, and the exposed portions of the first conductive pattern and the second conductive pattern by an electrolytic plating process with the external terminals connected to a plating electrode; and removing without weakening of the structural integrity of the fired laminate body a portion of the short-circuiting pattern connected to the second conductive pattern by cutting to disconnect the second conductive pattern from the short-circuiting pattern to make the second conductors of the second conductive pattern become floating conductors.

2. A method of fabricating a ceramic package body for holding semiconductor devices according to claim 1, wherein the at least one of the external terminals are connected to a ground.

3. A method of fabricating a ceramic package body for holding semiconductor devices according to claim 2, wherein an exposed surface of the short-circuiting pattern is coated with an insulating layer after forming the short-circuiting pattern.

4. A method of fabricating a ceramic package body for holding semiconductor devices according to claim 1, wherein an exposed surface of the short-circuiting pattern is coated with an insulating layer after forming the short-circuiting pattern.

* * * * *